(12) United States Patent
Kim

(10) Patent No.: US 7,964,926 B2
(45) Date of Patent: Jun. 21, 2011

(54) IMAGE SENSING DEVICES INCLUDING IMAGE SENSOR CHIPS, IMAGE SENSOR PACKAGE MODULES EMPLOYING THE IMAGE SENSING DEVICES, ELECTRONIC PRODUCTS EMPLOYING THE IMAGE SENSOR PACKAGE MODULES, AND METHODS OF FABRICATING THE SAME

(75) Inventor: Ki-Hong Kim, Yongin-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 583 days.

(21) Appl. No.: 12/137,311

(22) Filed: Jun. 11, 2008

(65) Prior Publication Data
US 2008/0237766 A1 Oct. 2, 2008

Related U.S. Application Data

(63) Continuation-in-part of application No. 12/047,941, filed on Mar. 13, 2008, now Pat. No. 7,531,860, which is a continuation of application No. 11/334,936, filed on Jan. 19, 2006, now Pat. No. 7,364,933.

(30) Foreign Application Priority Data

Feb. 2, 2005 (KR) ............................ 10-2005-09541

(51) Int. Cl.
*H01L 31/00* (2006.01)

(52) U.S. Cl. ......................... 257/431; 257/440; 257/444
(58) Field of Classification Search .......... 257/431–448, 257/E31.003, E31.127
See application file for complete search history.

(56) References Cited

U.S. PATENT DOCUMENTS

| 7,808,064 B2 * | 10/2010 | Kawasaki et al. ............. 257/432 |
| 7,875,948 B2 * | 1/2011 | Hynecek et al. ............. 257/447 |
| 2009/0224347 A1 * | 9/2009 | Kim et al. ..................... 257/432 |

FOREIGN PATENT DOCUMENTS

| JP | 2000-031441 | 1/2000 |
| JP | 2000-150846 | 5/2000 |

* cited by examiner

*Primary Examiner* — Cuong Q Nguyen
(74) *Attorney, Agent, or Firm* — F. Chau & Associates, LLC

(57) ABSTRACT

An image sensor package includes an image sensor chip, a handling substrate mounted on a front side of the image sensor chip and a through electrode disposed on a backside of the image sensor chip. The through electrode extends into the image sensor chip. Moreover, the image sensor chip includes a semiconductor substrate having a pixel region and a peripheral circuit region, a photoelectric transformation section disposed in the semiconductor substrate of the pixel region and a dielectric layer disposed on a front surface of the semiconductor substrate. The dielectric layer has a step region so that a top surface of the dielectric layer in the pixel region is lower than that of the dielectric layer in the peripheral circuit region. The image sensor chip further includes a conductive pad disposed on the dielectric layer in the peripheral circuit region and is electrically connected to the through electrode.

31 Claims, 19 Drawing Sheets

US 7,964,926 B2

IMAGE SENSING DEVICES INCLUDING IMAGE SENSOR CHIPS, IMAGE SENSOR PACKAGE MODULES EMPLOYING THE IMAGE SENSING DEVICES, ELECTRONIC PRODUCTS EMPLOYING THE IMAGE SENSOR PACKAGE MODULES, AND METHODS OF FABRICATING THE SAME

PRIORITY STATEMENT

This application is a continuation-in-part of U.S. patent application Ser. No. 12/047,941, filed on Mar. 13, 2008 now U.S. Pat. No.7,531,860, which is a continuation application of U.S. patent application Ser. No. 11/334,936, filed on Jan. 19, 2006 now U.S. Pat. No.7,364,933, which claims priority from Korean Patent Application No. 10-2005-09541, filed on Feb. 2, 2005 in the Korean Intellectual Property Office, the disclosures of which are all hereby incorporated by reference herein in their entireties.

BACKGROUND OF THE INVENTION

1. Field of the Invention

Exemplary embodiments relate to semiconductor packages, semiconductor package modules employing the semiconductor packages, electronic products employing the semiconductor package modules, and methods of fabricating the same. Specifically, the exemplary embodiments relate to image sensing devices including image sensor chips, image sensor package modules employing the image sensing devices, electronic products employing the image sensor package modules, and methods of fabricating the same.

2. Description of Related Art

Image sensors are semiconductor devices for converting an optical image into an electrical signal. Generally, image sensors are classified into charge coupled devices (CCDs) or complementary metal-oxide-silicon (CMOS) image sensors. CCD image sensors have certain benefits over CMOS image sensors such as having higher photosensitivity and better noise characteristics in comparison to CMOS image sensors. However, CMOS image sensors also hold several key benefits over CCD image sensors in that for example, CMOS image sensors may be prepared by simple processes, are suitable for high integration, and exhibit low power consumption. CCD image sensors on the other hand exhibit high power consumption and are generally not suitable for high integration processes.

With the increasing demand for highly integrated semiconductor devices, studies are being conducted for improving the characteristics of CMOS image sensors. A pixel of a conventional CMOS image sensor includes photodiodes for receiving light and CMOS elements for controlling image signals from the photodiodes. In the photodiodes of the conventional CMOS image sensor, electron-hole pairs are generated based upon the wavelength and intensity of red, green, and blue lights impinging through a color filter. In addition, output signals vary with the amount of the electrons generated. A conventional image sensor such as the above-described CMOS image sensor typically has a pixel region where a photoelectric transformation section is formed and also a peripheral circuit region for detecting signals from the pixel region. The peripheral circuit region is disposed to surround the pixel region. Moreover, an image sensor also includes multi-layer interconnections, interlayer dielectrics, and etch-stop layers. It is also noted that the greater the number of etch-stop layers that an image sensor has, the lower the transmittance of incident light will be for the image sensor. For the above reason, the intensity of light reaching the photodiode is lower than that of light impinging upon the highest layer. Thus, to enhance the photosensitivity of an image sensor, there is a need for a process which removes unnecessary interlayer dielectrics and etch-stop layers and which is also a relatively simple and cost effective process.

SUMMARY OF THE INVENTION

In an exemplary embodiment of the present invention, a method for forming an image sensor is provided. The method includes providing a semiconductor substrate having a pixel region and a peripheral circuit region, forming a photoelectric transformation section at the semiconductor substrate of the pixel region, forming a plurality of interlayer dielectrics over the semiconductor substrate with interconnections interposed therebetween, forming a passivation layer, partially patterning the passivation layer at the peripheral circuit region to form a via hole exposing the interconnection and removing the passivation layer and the underlying interlayer dielectric at the pixel region. The method further includes forming a conductive layer to fill the via hole and etching the conductive layer to remove the conductive layer at the pixel region and form a via plug and a conductive pad at the peripheral circuit region. The via plug fills the via hole and the conductive pad protrudes outwardly from the via hole.

In another exemplary embodiment, a method for forming an image sensor is provided. The method includes preparing a semiconductor substrate having a pixel region and a peripheral circuit region, forming device isolation layers on the semiconductor substrate to define active regions, forming a photoelectric transformation section at the active region of the pixel region, forming a shield layer on an entire surface of the semiconductor substrate and forming a plurality of intermediate interconnection layers on the shield layer. Each of the intermediate interconnection layers includes a first etch-stop layer, a first interlayer dielectric on the first etch-stop layer, and a first interconnection overlapping the device isolation layer at the active region and penetrating the first interlayer dielectric and the first etch-stop layer. The method further includes forming at least one top interconnection layer on the intermediate interconnection layer, the top interconnection layer including a second etch-stop layer, a second interlayer dielectric on the second etch-stop layer, and a second interconnection disposed only at the peripheral circuit region and penetrating the second interlayer dielectric and the second etch-stop layer, forming a passivation layer on the top interconnection layer, partially patterning the passivation layer at the peripheral circuit region to form a via hole exposing the second interconnection while removing the passivation layer and the top interconnection layer at the pixel region to expose the intermediate interconnection layer, forming a conductive layer to fill the via hole, and etching the conductive layer to remove the conductive layer at the pixel region and form a via plug and a conductive pad at the peripheral circuit region. The via plug fills the via hole and the conductive layer protrudes outwardly from the via hole.

In another exemplary embodiment, an image sensor is provided. The image sensor includes a semiconductor substrate having a pixel region and a peripheral circuit region, a device isolation layer disposed at the semiconductor substrate to define an active region, a photoelectric transformation section disposed in the semiconductor substrate at the pixel region, a shield layer disposed on the semiconductor substrate and a plurality of intermediate interconnection layers disposed on the shield layer. Each of the intermediate interconnection layers includes a first etch-stop layer, a first interlayer dielectric on the first etch-stop layer, and a first interconnection overlapping the device isolation layer at the active region and penetrating the first interlayer dielectric and the first etch-stop layer. The image sensor further includes at least one top interconnection layer disposed on the intermediate interconnection layer, the top interconnection layer including a second etch-stop layer, a second interlayer dielectric on the second etch-stop layer, and a second interconnection disposed only at the peripheral circuit region and penetrating the second interlayer dielectric and the second etch-stop layer, a passivation layer disposed on the top interconnection layer, a via plug connected to the second interconnection through the passivation layer and a conductive pad at the peripheral circuit region, a resin layer connected to the shield layer through the interlayer dielectric and the first etch-stop layer of the intermediate dielectric at the pixel region, a planarization layer disposed to cover the conductive pad, the top interconnection layer, the resin layer, and the intermediate interconnection layer, and a color filter layer and a microlens disposed on the planarization layer at the pixel region.

In accordance with another exemplary embodiment of the present invention, an image sensor package is provided. The image sensor package includes an image sensor chip, a handling substrate mounted on a front side of the image sensor chip and a through electrode disposed on a backside of the image sensor chip. The through electrode extends into the image sensor chip. Moreover, the image sensor chip includes a semiconductor substrate having a pixel region and a peripheral circuit region, a photoelectric transformation section disposed in the semiconductor substrate of the pixel region and a dielectric layer disposed on a front surface of the semiconductor substrate. The dielectric layer has a step region so that a top surface of the dielectric layer in the pixel region is lower than that of the dielectric layer in the peripheral circuit region. The image sensor chip further includes a conductive pad disposed on the dielectric layer in the peripheral circuit region and is electrically connected to the through electrode.

In accordance with an exemplary embodiment of the present invention, an image sensor package module is provided. The image sensor package module includes an image sensor package and an optical lens mounted on a front surface of the image sensor package. The image sensor package includes a semiconductor substrate having a pixel region and a peripheral circuit region, a photoelectric transformation section disposed in the semiconductor substrate of the pixel region, and a dielectric layer disposed on a front surface of the semiconductor substrate. The dielectric layer has a step region so that a top surface of the dielectric layer disposed in the pixel region is lower than that of the dielectric layer in the peripheral circuit region. The image sensor package further includes a conductive pad disposed on the dielectric layer in the peripheral circuit region, a handling substrate disposed over the dielectric layer and the conductive pad and a through electrode disposed on a back surface of the image sensor chip and electrically connected to the conductive pad. Moreover, the through electrode extends into the semiconductor substrate and the dielectric layer, and wherein the optical lens is disposed over the handling substrate.

BRIEF DESCRIPTION OF THE DRAWINGS

Exemplary embodiments of the present invention can be understood in more detail from the following description taken in conjunction with the accompanying drawings, in which.

Figure 1:
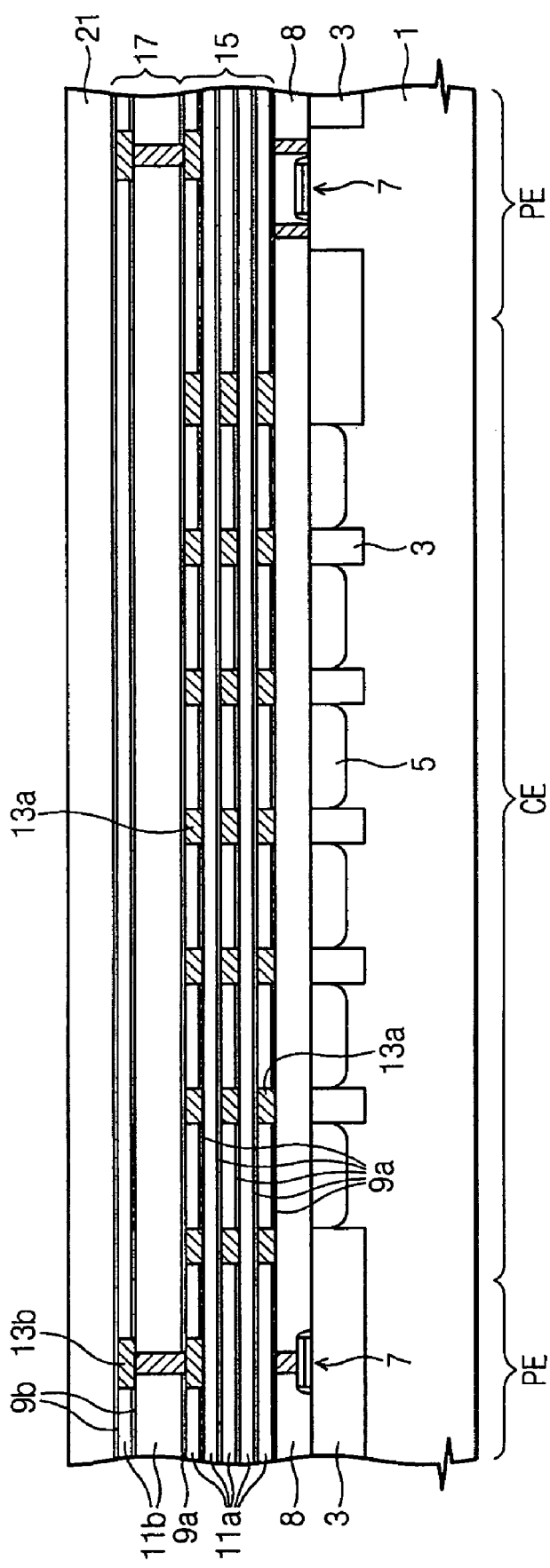
FIG. 1 through FIG. 6 are flow diagrams showing the steps of forming an image sensor according to an exemplary embodiment of the present invention.

DETAILED DESCRIPTION OF THE
EXEMPLARY EMBODIMENTS OF THE
INVENTION

The present invention will now be described more fully hereinafter with reference to the accompanying drawings, in which preferred embodiments of the invention are shown. The invention may, however, be embodied in different forms and should not be construed as limited to the embodiments set forth herein. The invention may be applied to, for example, methods of forming CMOS or CCD image sensors. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

Spatially relative terms, such as "below", "above", "over", "on", "under", "beneath" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As illustrated in the exemplary embodiment of FIGS. 1-6, device isolation layers 3 are formed at a semiconductor substrate 1 having a pixel region CE and a peripheral circuit region PE to define active regions. Impurities are implanted into the active region to form a photoelectric transformation section 5 such as a photodiode. When light impinges on the photoelectric transformation section 5, electron-hole pairs are generated in the photoelectric transformation section 5. Transistors 7 are formed on the substrate 1. Moreover, transistors are disposed at the pixel region CE to sense charges generated at the photoelectric transformation section 5 and transmit signals. A shield layer 8 is formed on substantially the entire surface of the substrate 1 to shield the photoelectric transformation section 5 from subsequent processes. An intermediate interconnection layer 15 is formed on the substrate 1. The intermediate interconnection layer 15 includes a first etch-stop layer 9a, a first interlayer dielectric 11a, and first interconnections 13a penetrating the first interlayer dielectric 112a and the first etch-stop layer 9a. In the pixel region CE, the first interconnections 13a overlap the device isolation layers 3 to prevent interference of a path of light impinging on the photoelectric transformation section 5. A top interconnection layer 17 is formed on the intermediate interconnection layer 15. The top interconnection layer 17 includes a second etch-stop layer 9b, a second interlayer dielectric 11b, and second interconnections 13b penetrating the second interlayer dielectric 11b and the second etch-stop layer 9b. The second interconnections 13b are not disposed on the pixel region CE, but rather are disposed only at the peripheral circuit region PE. The etch-stop layers 9a and 9b are made of, for example, silicon nitride ($Si_3N_4$). The interlayer dielectrics 11a and 11b are made of, for example, silicon oxide ($SiO_2$) or silicon oxyfluoride (SiOF). A passivation layer 21 is formed on the top interconnection layer 17. The passivation layer 21 is a triple layer made of, for example, silicon nitride-silicon oxide-silicon nitride. The passivation layer 21 serves to block external moisture.

Figure 2:
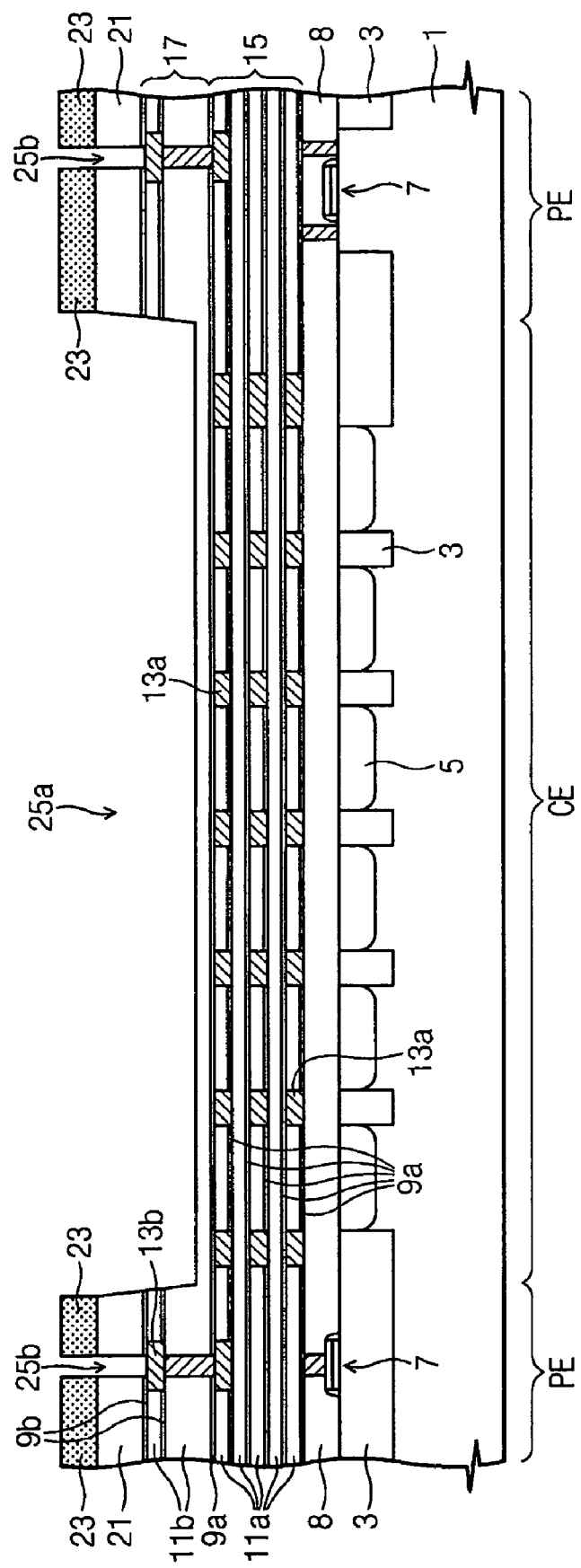

As illustrated in FIG. 2, a first photoresist pattern 23 is formed on the passivation layer 21. The first photoresist pattern 23 has an opening that completely exposes the pixel region CE while exposing a via hole at the peripheral circuit region PE. By means of an etch process using the photoresist pattern 23 as an etch mask, the passivation layer 21 and the underlying the second etch-stop layer 9b in the peripheral circuit region PE are patterned to form a via hole 25b and the passivation layer 21 and the underlying top interconnection layer 17 in the pixel region CE are removed to form a wide recessed region 25a. Thus, the second interlayer dielectrics 11b and the second etch-stop layers 9b are removed in the pixel region CE. In the etch process of this exemplary embodiment, the top interconnection layer 17 is not removed completely and the second interlayer dielectric 110b of the top interconnection layer 17 partially remains, as illustrated in FIG. 2. The etch process is carried out using fluorocarbon gas such as trifluoromethane ($CF_3H$), difluoromethane ($CF_2H_2$) fluoromethane ($CFH_3$), and carbon tetrafluoride ($CF_4$) as an etch gas.

Figure 3:
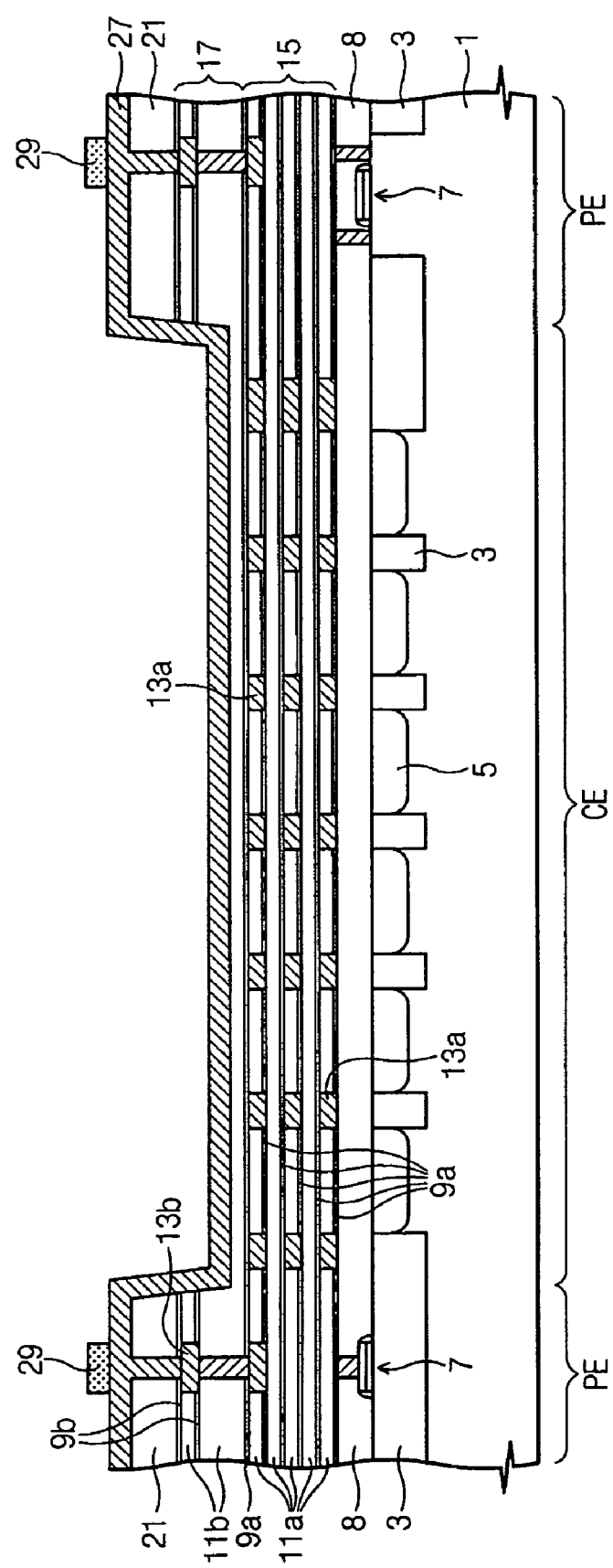

As illustrated in FIG. 3, the photoresist pattern 23 is removed by means of ashing and stripping processes. A conductive layer 27 is conformally stacked on an entire surface of a substrate 1 where the via hole 25b and the recessed region 25a are formed, thereby filling the via hole 25b. The conductive layer 27 is a layer of metal such as, for example, aluminum. Formation of the conductive layer 27 is done by means of chemical vapor deposition (CVD) process. A conductive pad is defined on the conductive layer 27 and is connected to an external terminal, and a second photoresist pattern 29 is formed to overlap the via hole 25b.

Figure 4:
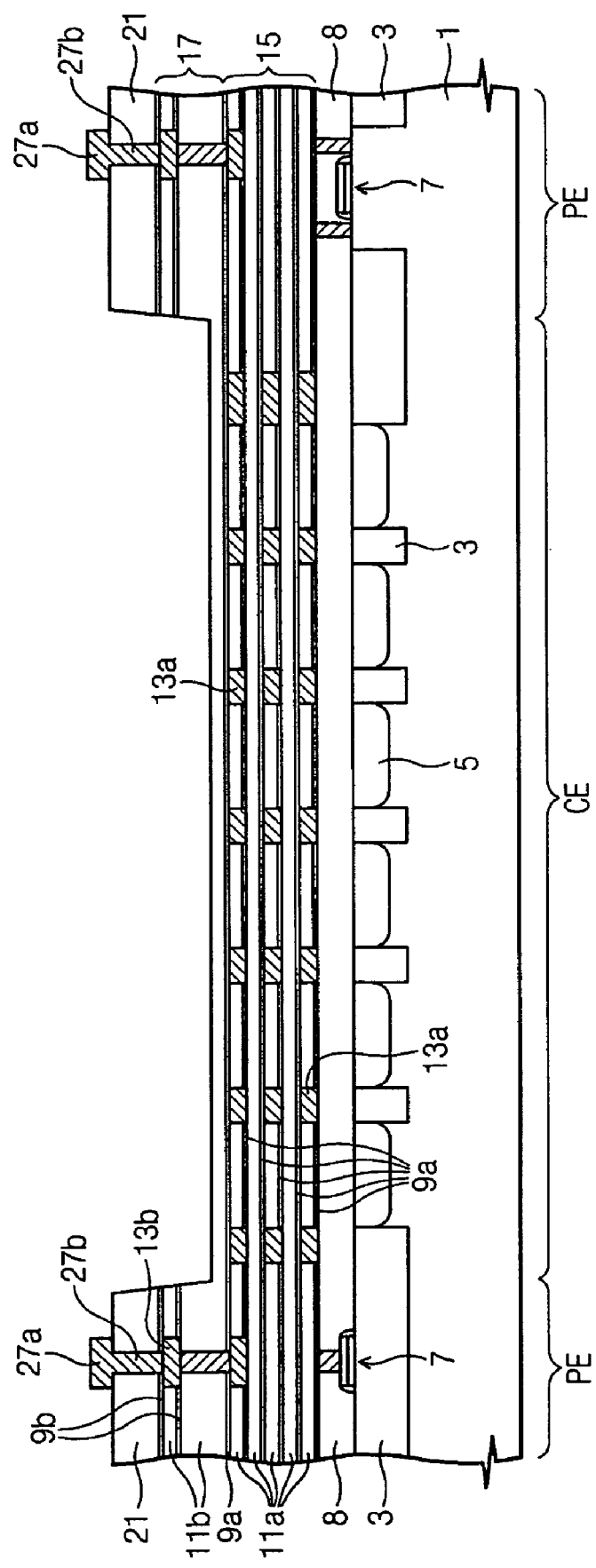

As illustrated in FIG. 4, using the second photoresist pattern 29 as an etch mask, the conductive layer 27 is patterned to be removed completely at the pixel region CE and form a via plug 27b and a conductive pattern 27a in the via hole at the peripheral circuit region 27a. The conductive pattern 27a protrudes outwardly from the via hole 25b and is connected to the via plug 27b. After the etch process is carried out, the second interlayer dielectric 11b of the remaining top interconnection layer 17 at the pixel region CE is removed and the first etch-stop layer 9a is exposed.

As previously described above in relation to the description of a conventional image sensor, loss caused by light interference arises at boundaries between the etch-stop layers 9a and 9b, the interlayer dielectrics 11a and 11b, and the passivation layers 21. Further, the intensity of light impinging on the photoelectric transformation section 5 is lowered due to intrinsic absorption coefficients of the layers. Thus, to enhance the photosensitivity of an image sensor, the top interconnection layer 17 on the pixel region where the photoelectric transformation section 5 is disposed should be removed. Referring to FIG. 3 and FIG. 4 of this exemplary embodiment, the top interconnection layer 17 is removed when the via hole 25b is formed using the first photoresist pattern 23 that is a mask for forming a conductive pad to be connected to an external terminal. Accordingly, the present exemplary embodiment provides a simplified and cost effective process wherein the photosensitivity of an image sensor is enhanced in comparison to conventional image sensors and conventional methods of forming the same.

Figure 5:
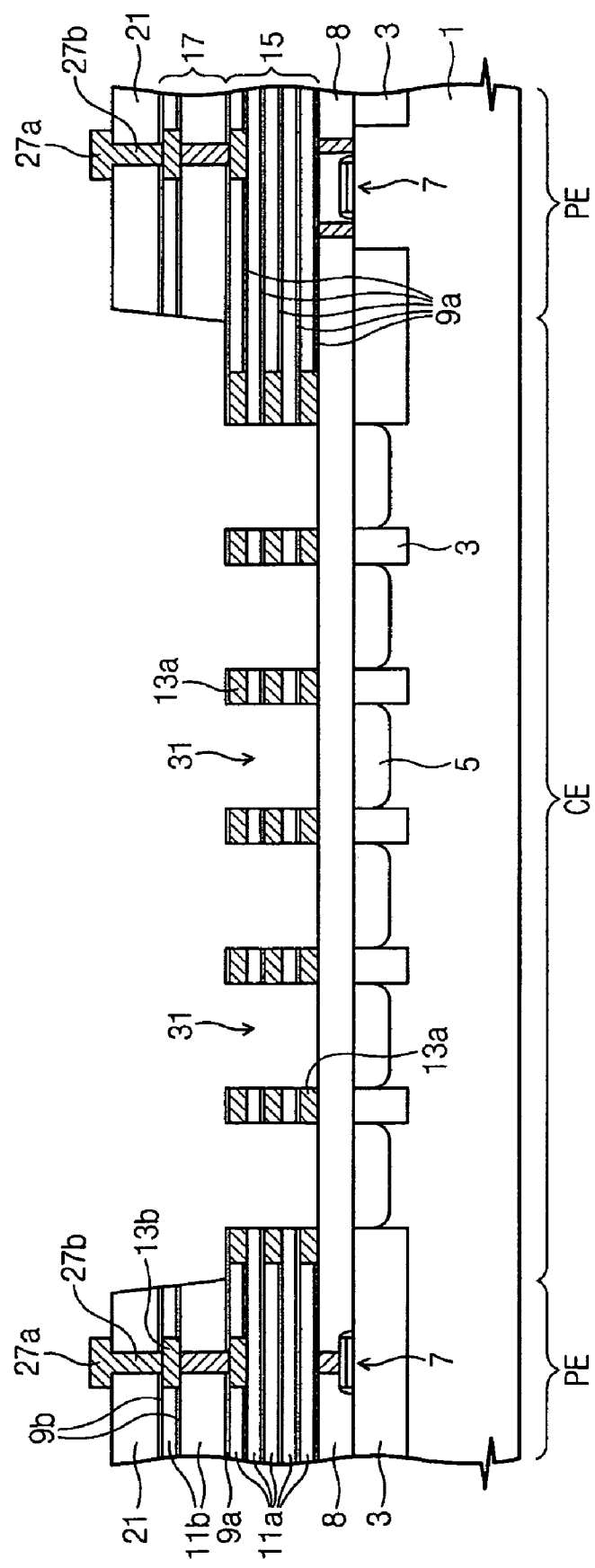

As illustrated in FIG. 5, an etch process is carried out using a third photoresist pattern covering the peripheral circuit region PE except the photoelectric transformation section 5 at the pixel region CE. Thus, the interlayer dielectrics 11a and the first etch-stop layers 9a between the first interconnections 13a of the intermediate interconnection layer 15 are patterned to form a cavity exposing the shield layer 8 on the photoelectric transformation section 5.

Figure 6:
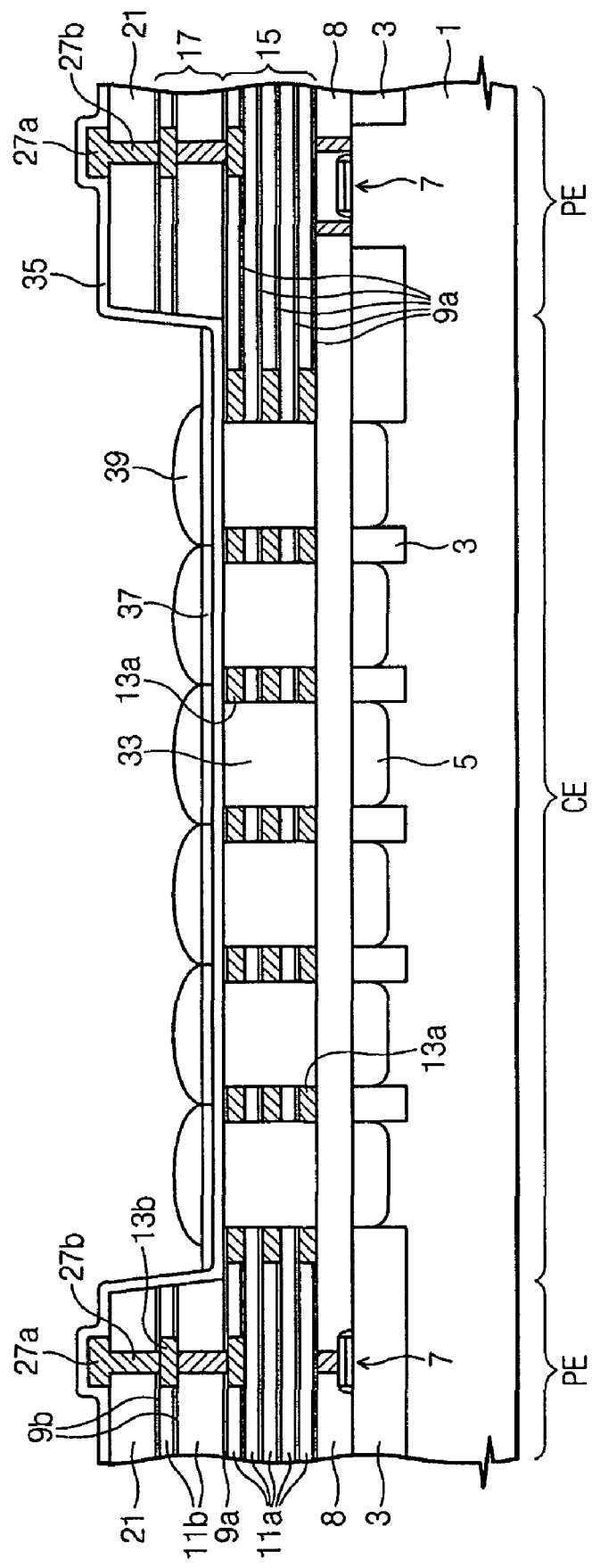

As illustrated in FIG. 6, the third photoresist pattern is removed. After coating a thermosetting resin layer on the entire surface of the substrate 1, it is heated to harden the resin layer. An etch-back process is carried out to remove the hardened resin layer outside the cavity 31 and form a resin layer 33 within the cavity 31. The resin layer 33 in the cavity 31 may have a top surface which is lower than a top surface of the top interconnection layer 17. For example, the top surface of the resin layer 33 in the cavity 31 may be substantially coplanar with a top surface of the intermediate interconnection layer 15. The resin layer has a transmittance of at least about 50 percent. A planarization layer 35 is coated on substantially the entire surface of a semiconductor substrate 1 where the resin layer 33 is formed. The planarization layer 35 is hardened by means of a heat treatment and is made of a thermosetting resin of a polyimide group. In the pixel region CE, a color filter layer 37 is formed on the planarization layer 35. In this exemplary embodiment, the color filter layer 37 is a red-green-blue (RGB) color filter for dividing the natural color into the three primary colors and a complementary color filter for dividing the natural color into four colors, i.e., cyan, yellow, green, and magenta (CYGM). A microlens 39 is formed on the color filter layer 37. The planarization layer in the peripheral circuit region PE is partially patterned in a subsequent process to form an opening exposing the conductive pattern 27a. A wire bonding process is carried out to connect a wire to the opening through the conductive pad 27a.

In the image sensor of FIG. 6, etch-stop layers 9a and 9b and interlayer dielectrics 11a and 11b that reflect or absorb a light on the photoelectric transformation section 5 of the section region CE are removed, thereby increasing the intensity of the light and enhancing the photosensitivity of the image sensor.

In sum, the process of the exemplary embodiments of the invention, by removing unnecessary layers at the pixel region when the via hole is formed at the peripheral circuit region in forming an image sensor, provides a simplified process wherein the photosensitivity of an image sensor prepared therefrom is enhanced in comparison to conventional processes.

Figure 7:
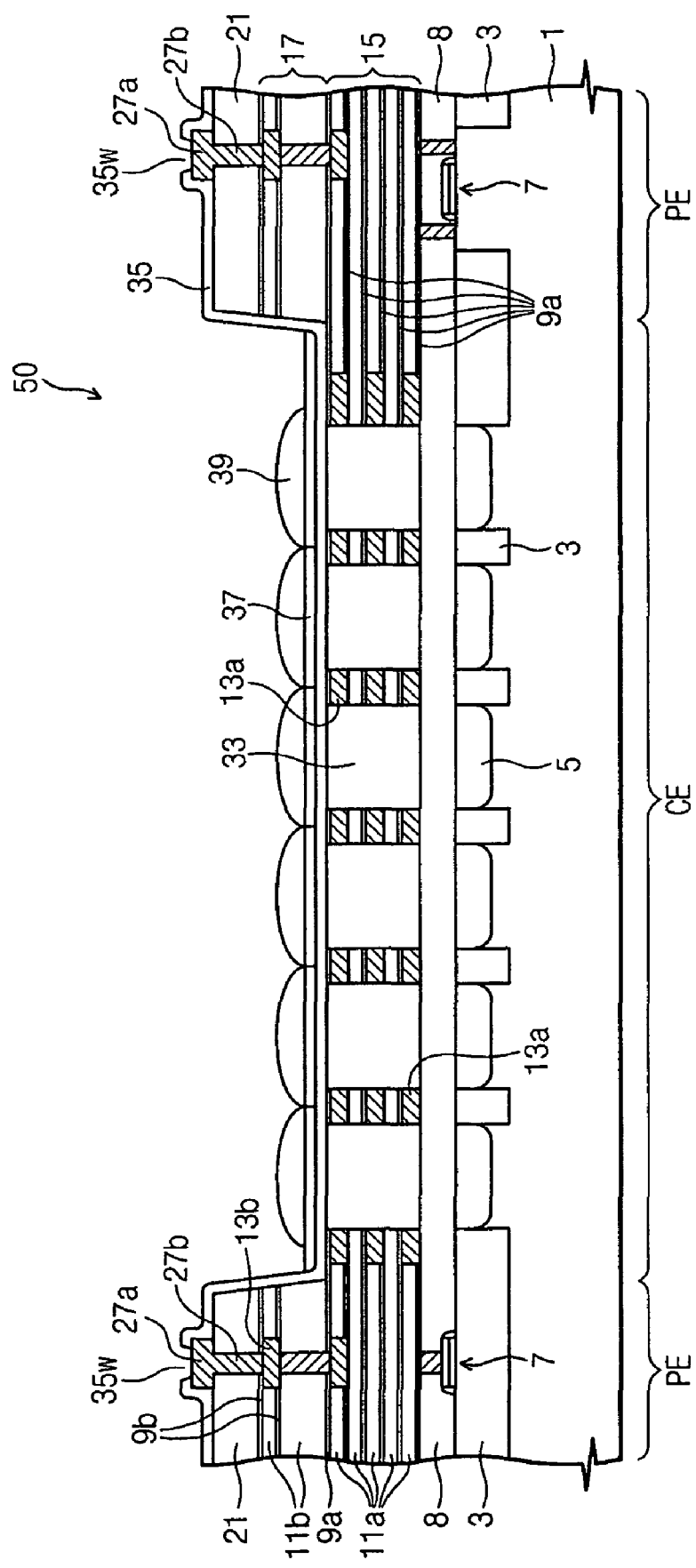
FIG. 7 is a cross sectional view illustrating an image sensor chip according to an exemplary embodiment of the present invention.

FIG. 7 is a cross sectional view illustrating an image sensor chip according to an exemplary embodiment of the present invention.

Referring to FIG. 7, after formation of the micro lenses 39, the planarization layer 35 may be partially patterned to form pad windows 35w which respectively expose the conductive pads 27a, as described with reference to FIG. 6. As a result, an image sensing device 50 (e.g., an image sensor chip) may be completed.

Figure 8:
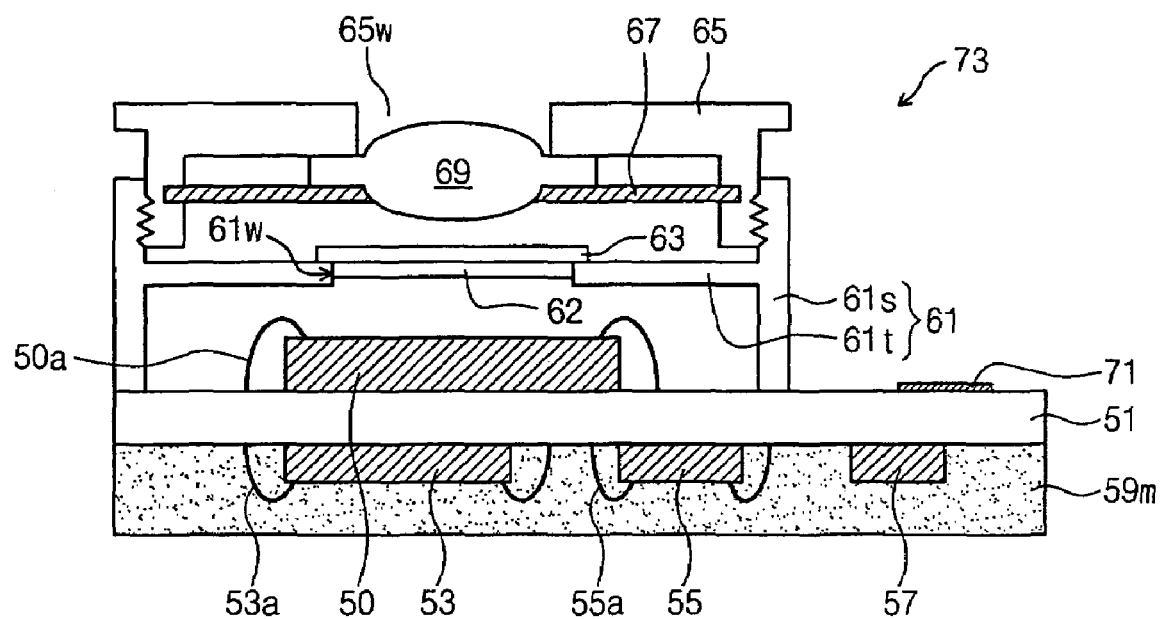
FIG. 8 is a cross sectional view illustrating an image sensor package module including an image sensor chip as shown in FIG. 7.

FIG. 8 is a cross sectional view illustrating an image sensor package module 73 including the image sensor chip 50 shown in FIG. 7.

Referring to FIG. 8, a wiring substrate 51, for example, a mother board is prepared. The wiring substrate 51 may have a first surface and a second surface which face each other. At least one semiconductor chip may be mounted on the first surface of the wiring substrate 51 using a conventional die attaching process. In an exemplary embodiment, the at least one semiconductor chip may comprise one or more semiconductor chips. For example, the at least one semiconductor chip may comprise a non-memory chip 53 and a memory chip 55. Further, a passive element 57 may be mounted on the first surface of the wiring substrate 51. The non-memory chip 53 may include, for example, at least one of an analog to digital converter (an A/D converter), a digital to analog converter (a D/A converter) and a digital signal processor (DSP). The memory chip 55 may include a nonvolatile memory chip such as, for example, a flash memory chip or an electrically erasable programmable read only memory (EEPROM) chip. In addition, the passive element 57 may include, for example, a capacitor, an inductor or a resistor. Backsides of the chips 53 and 55 may be grinded before the chips 53 and 55 are mounted on the wiring substrate 51, thereby reducing the thickness of the chips 53 and 55.

The non-memory chip 53 may be electrically connected to the wiring substrate 51 through bonding wires 53a. Similarly, the memory chip 55 may be electrically connected to the wiring substrate 51 through bonding wires 55a. The boding wires 53a and 55a may be formed using a conventional wire bonding process. After formation of the bonding wires 53a and 55a, the bonding wires 53a and 55a, the semiconductor chips 53 and 55, and the passive element 57 may be encapsulated by an encapsulation body 59m such as, for example, an epoxy molding compound (EMC). The encapsulation body 59m may be formed using a conventional semiconductor package technique.

Subsequently, the image sensor chip 50 shown in FIG. 7 may be mounted on the second surface of the wiring substrate 51. A backside of the image sensor chip 50 may also be grinded before the image sensor chip 50 is mounted on the wiring substrate 51, thereby reducing the thickness of the image sensor chip 50. The image sensor chip 50 mounted on the wiring substrate 51 may be electrically connected to the wiring substrate 51 through bonding wires 50a. One end of each of the bonding wires 50a may be bonded to one of the conductive pads (27a of FIG. 7). A lens barrel 61 is mounted on the second surface of the wiring substrate 51. The lens barrel 61 may have a sidewall body 61s and a lid 61t. The lens barrel 61 may be positioned so that the sidewall body 61s surrounds the image sensor chip 50 and the bonding wires 50a. In this case, the lid 61t of the lens barrel 61 may be located over the image sensor chip 50, and the lid 61t may have an opening 61w which exposes at least the pixel region (CE of FIG. 7) of the image sensor chip 50. A transparent plate 62, for example, a glass plate may be installed in the opening 61w, and an infrared filter 63 may be disposed on the transparent plate 62. The infrared filter 63 may have a function of passing through visible rays but blocking unnecessary infrared rays having frequencies of at least a predetermined value.

A lens holder 65 may be installed on the lid 61t of the lens barrel 61. The lens holder 65 and the lens barrel 61 may be linked to each other, for example, by engaging a screw formed on an inner face of the sidewall body 61s with another screw formed on an outer surface of a lower portion of the lens holder 65. An optical lens 69 is accommodated inside of the lens holder 65 and is located over the opening 61w. The optical lens 69 may be supported by a lens supporter 67 installed in the lens holder 65. In addition, the optical lens 69 may be exposed to the external environment through a lens window 65w of the lens holder 65. The infrared filter 63 may be located between the optical lens 69 and the transparent plate 62, as illustrated in FIG. 8. Alternatively, the infrared filter 63 may be disposed on the optical lens 69 and on the opposite side of the transparent plate 62.

The image sensor package module 73 may further include a plurality of connection terminals 71 which are formed on the second surface of the wiring substrate 51 outside the lens barrel 61. The output signals of the image sensor package module 73 may be transmitted to an external device through the connection terminals 71.

Figure 9:
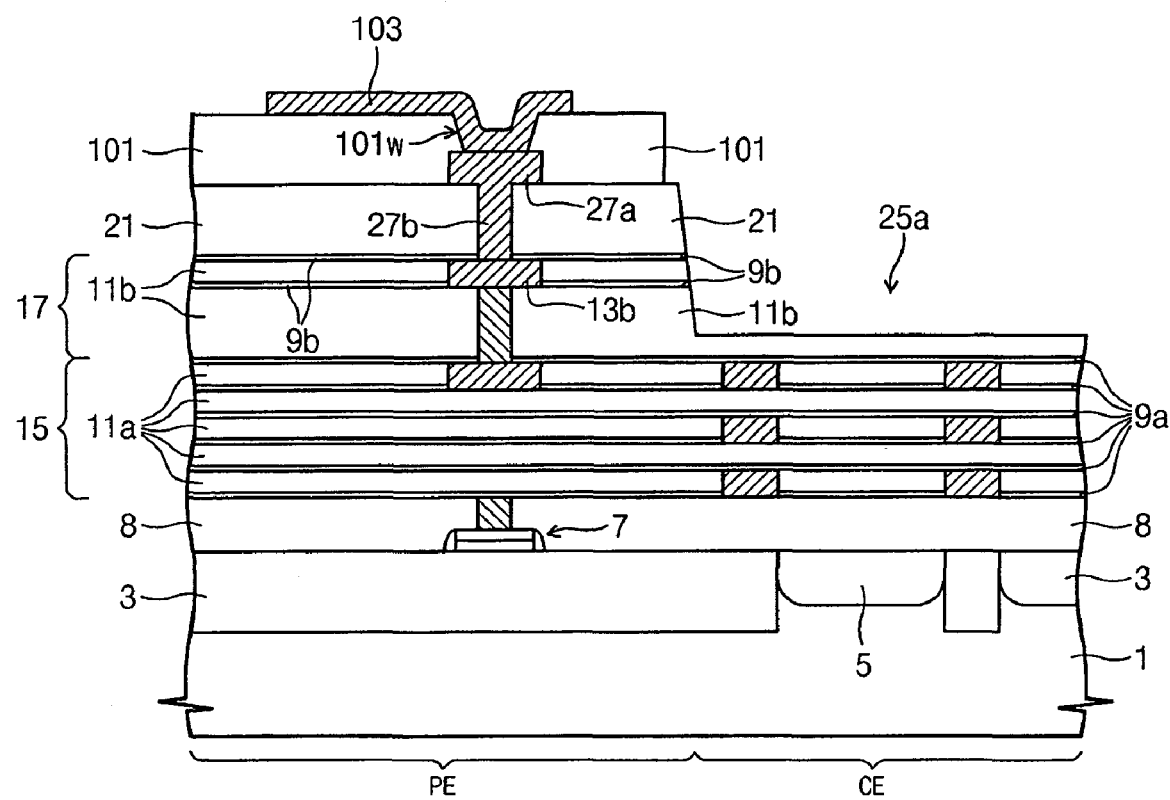
FIGS. 9 and 10 are cross sectional views illustrating methods of fabricating an image sensor package according to an exemplary embodiment of the present invention.
Figure 10:
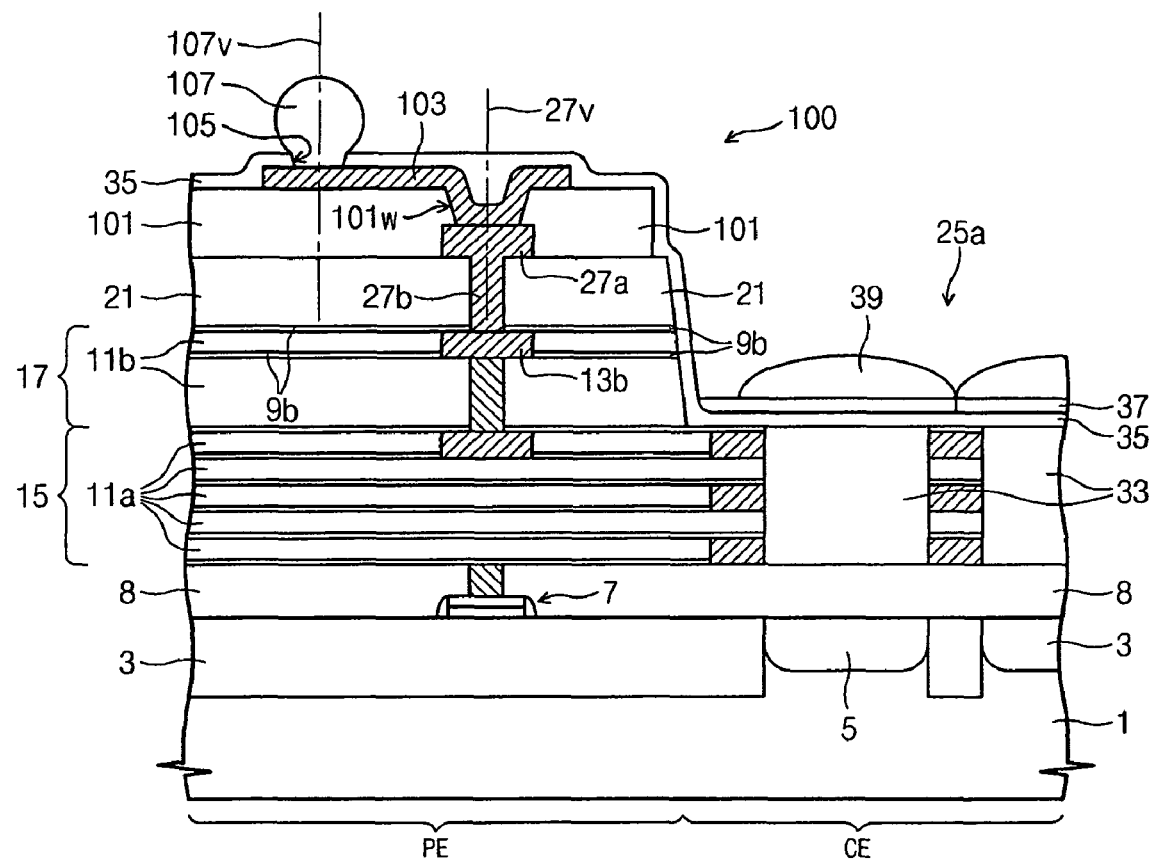

FIGS. 9 and 10 are cross sectional views illustrating methods of fabricating an image sensor package according to another exemplary embodiment of the present invention.

Referring to FIG. 9, the structure from the semiconductor substrate 1 to the conductive pads 27a may be formed using the same methods as described with reference to FIGS. 1 to 4. After formation of the conductive pads 27a, an insulation layer 101 may be formed on the substrate including the conductive pads 27a. The insulation layer 101 may be formed of, for example, a polyimide layer. The insulation layer 101 may be then patterned to form a plurality of openings 101w which expose the conductive pads 27a respectively. A conductive layer is formed on the first insulation layer 101 and in the openings 101w. The conductive layer is patterned to form a plurality of conductive lines 103 in the peripheral circuit region PE. The conductive lines 103 may act as redistribution lines 103. Each of the conductive lines 103 may be electrically connected to one of the conductive pads 27a through one of the openings 101w. The insulation layer 101 may then be patterned to expose the recessed region 25a in the pixel region CE.

Referring to FIG. 10, the resin layer 33, the planarization layer 35, the color filter layer 37 and the micro lenses 39 may be formed on the substrate including the patterned insulation layer 101 using the same methods as described with reference to FIGS. 5 and 6. The planarization layer 35 may be then patterned to form a plurality of openings 105 which expose predetermined portions of the conductive lines 103 respectively. The openings 105 may not overlap the conductive pads 27a, as illustrated in FIG. 9. A plurality of external terminals 107 may be formed on the exposed portions of the conductive lines 103. The external terminals 107 may be, for example, solder balls or solder bumps. At least one of the external terminals 107 may not be self-aligned with the corresponding conductive pad 27a. That is, a vertical axis 107v passing through a central point of the external terminal 107 may be spaced apart from a vertical axis 27v passing through a central point of the conductive pad 27a connected to the external terminal 107, as illustrated in FIG. 10. Accordingly, the external terminals 107 may be arrayed at required positions regardless of the positions of the conductive pads 27a. Therefore, the conductive lines 103 may act as the redistribution lines, as mentioned above. As a result, an image sensing device 100 (e.g., an image sensor package) having the redistribution lines 103 and the external terminals 107 may be completed.

Figure 11:
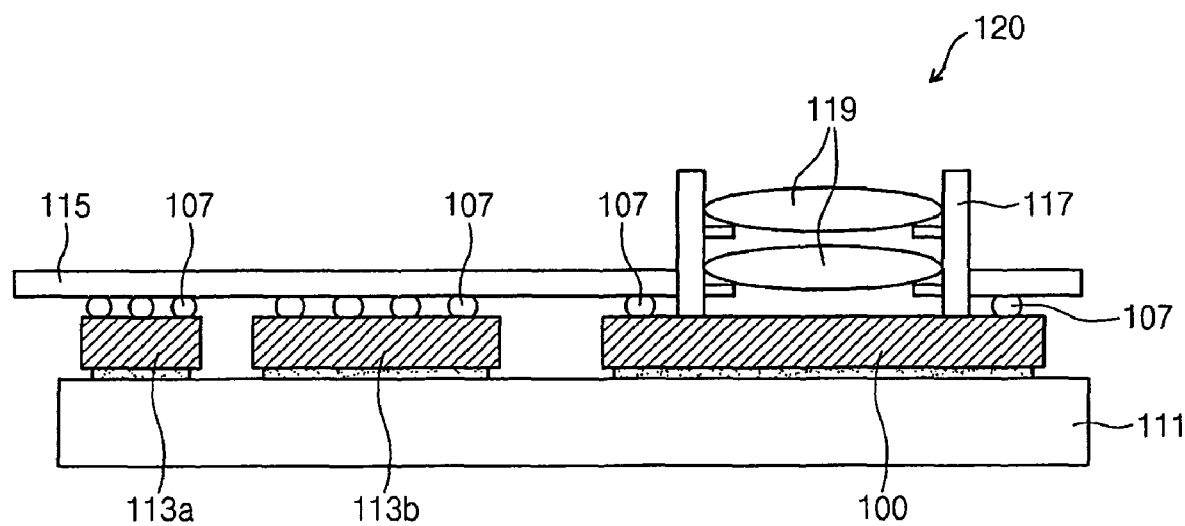
FIG. 11 is a cross sectional view illustrating another image sensor package module including an image sensor package as shown in FIG. 10.

FIG. 11 is a cross sectional view illustrating another image sensor package module 120 including the image sensor package 100 shown in FIG. 10.

Referring to FIG. 11, an isolating base 111, for example, an isolating substrate may be provided. The image sensor package 100 illustrated in FIG. 10 may be mounted on the isolation base 111. Further, at least one semiconductor package may be mounted on the insulating base 111. The at least one semiconductor package may be located to be spaced apart from the image sensor package 100. In an exemplary embodiment, the at least one semiconductor package may comprise one or more semiconductor packages. For example, the at least one semiconductor package may comprise a non-memory semiconductor package 113a and a memory semiconductor package 113b. The non-memory semiconductor package 113a may include, for example, at least one of an analog to digital converter (an A/D converter), a digital to analog converter (a D/A converter) and a digital signal processor (DSP). The memory semiconductor package 113b may include a nonvolatile memory package such as, for example, a flash memory package or an EEPROM package. Each of the non-memory semiconductor package 113a and the memory semiconductor package 113b may have the external terminals 107 like the image sensor package 100.

A wiring substrate 115 may be mounted on the packages 100, 113a and 113b. A lens holder 117 may be disposed to penetrate a portion of the wiring substrate 115, and at least one optical lens 119 may be installed in the lens holder 117. The wiring substrate 115 may have a plurality solder joints, and the solder joints may be in contact with the external terminals 107. Further, the wiring substrate 115 may be mounted on the packages 100, 113a and 113b so that the optical lens 119 may be located over the pixel region CE of the image sensor package 100. As a result, an image sensor package module 120 having the redistribution lines 103 and the external terminals 107 may be completed. Backsides of the chips 100, 113a and 113b may be grinded before the external terminals 107 are formed, thereby reducing the thickness of the chips 100, 113a and 113b.

FIGS. 12 to 16 are cross sectional views illustrating methods of fabricating an image sensor package according to still another exemplary embodiment of the present invention.

Figure 12:
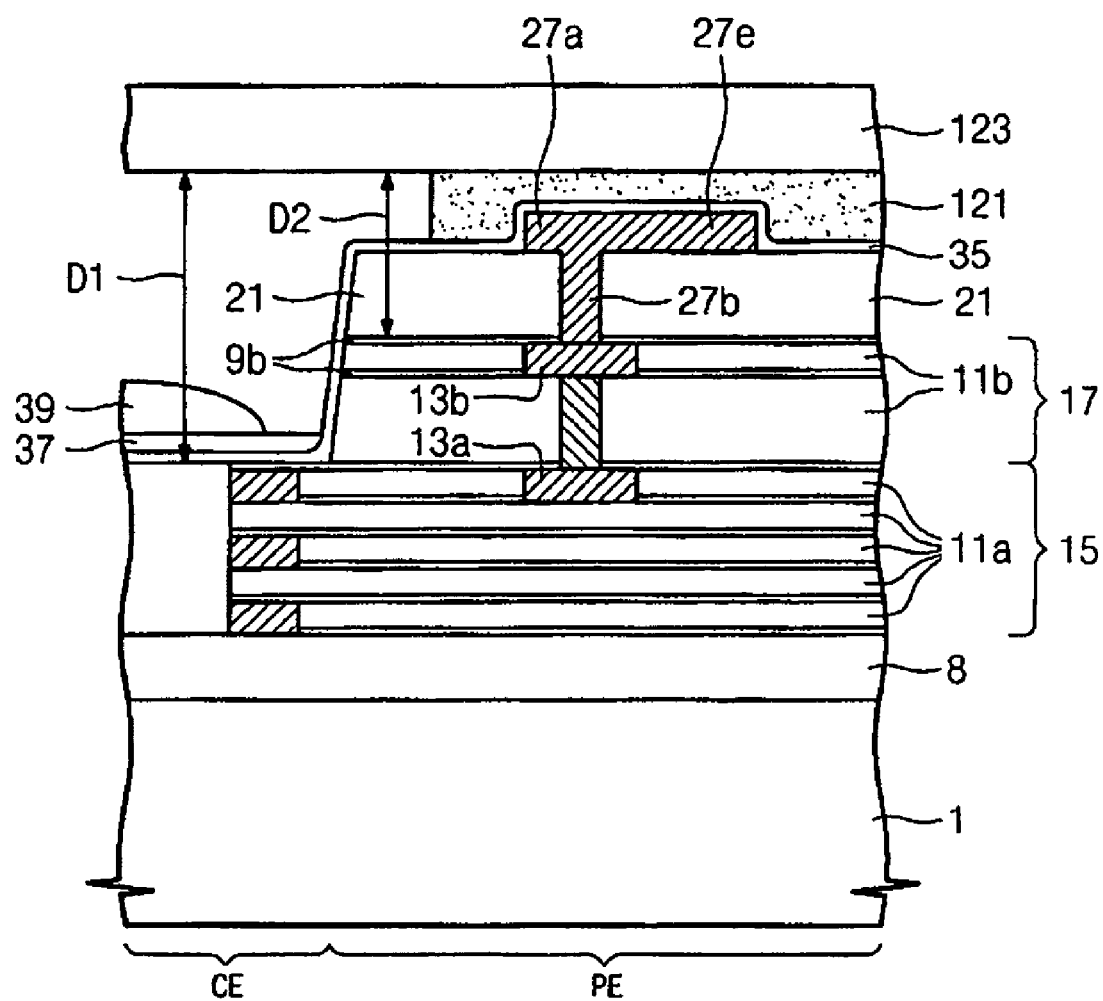
FIGS. 12 to 16 are cross sectional views illustrating methods of fabricating an image sensor package according to an exemplary embodiment of the present invention.

Referring to FIG. 12, the structure from the semiconductor substrate 1 to the micro lenses 39 may be formed using the same methods as described with reference to FIGS. 1 to 6. However, in an exemplary embodiment, the transistors 7 may not be formed under the conductive pads 27a. Alternatively, at least one of the conductive pads 27a may be formed to have an extension 27e which does not overlap the first and second interconnections 13a and 13b, as illustrated in FIG. 12. After formation of the micro lenses 39, a handling substrate 123 may be mounted on a front side of the image sensor chip including the micro lenses 39. In this case, a first distance D1 between the handling substrate 123 and the interlayer dielectric layer (e.g., the intermediate interconnection layer 15) in the pixel region CE may be greater than a second distance D2 between the handling substrate 123 and the interlayer dielectric layer (e.g., the top interconnection layer 17) in the peripheral circuit region PE. This is because a top surface of the interlayer dielectric layer (e.g., the intermediate interconnection layer 15) in the pixel region CE may be lower than a top surface of the interlayer dielectric layer (e.g., the top interconnection layer 17) in the peripheral circuit region PE as illustrated in FIG. 6 or 7.

In an exemplary embodiment, the handling substrate 123 may be a transparent substrate, for example, a glass substrate. Thus, external lights may be irradiated onto the pixel region CE through the handling substrate 123, thereby reaching the photoelectric transformation sections 5. One surface of the handling substrate 123 may be attached to the planarization layer 35 in the peripheral circuit region PE of the image sensor chip by an adhesive material 121. In this case, the adhesive material 121 may not be disposed between the pixel region CE and the handling substrate 123. This is for preventing external lights traveling toward the micro lenses 39 from being blocked due to the presence of the adhesive material 121. A backside of the semiconductor substrate 1 may be grinded before or after the handling substrate 123 is mounted on the image sensor chip, thereby reducing the thickness of the semiconductor substrate 1.

Figure 13:
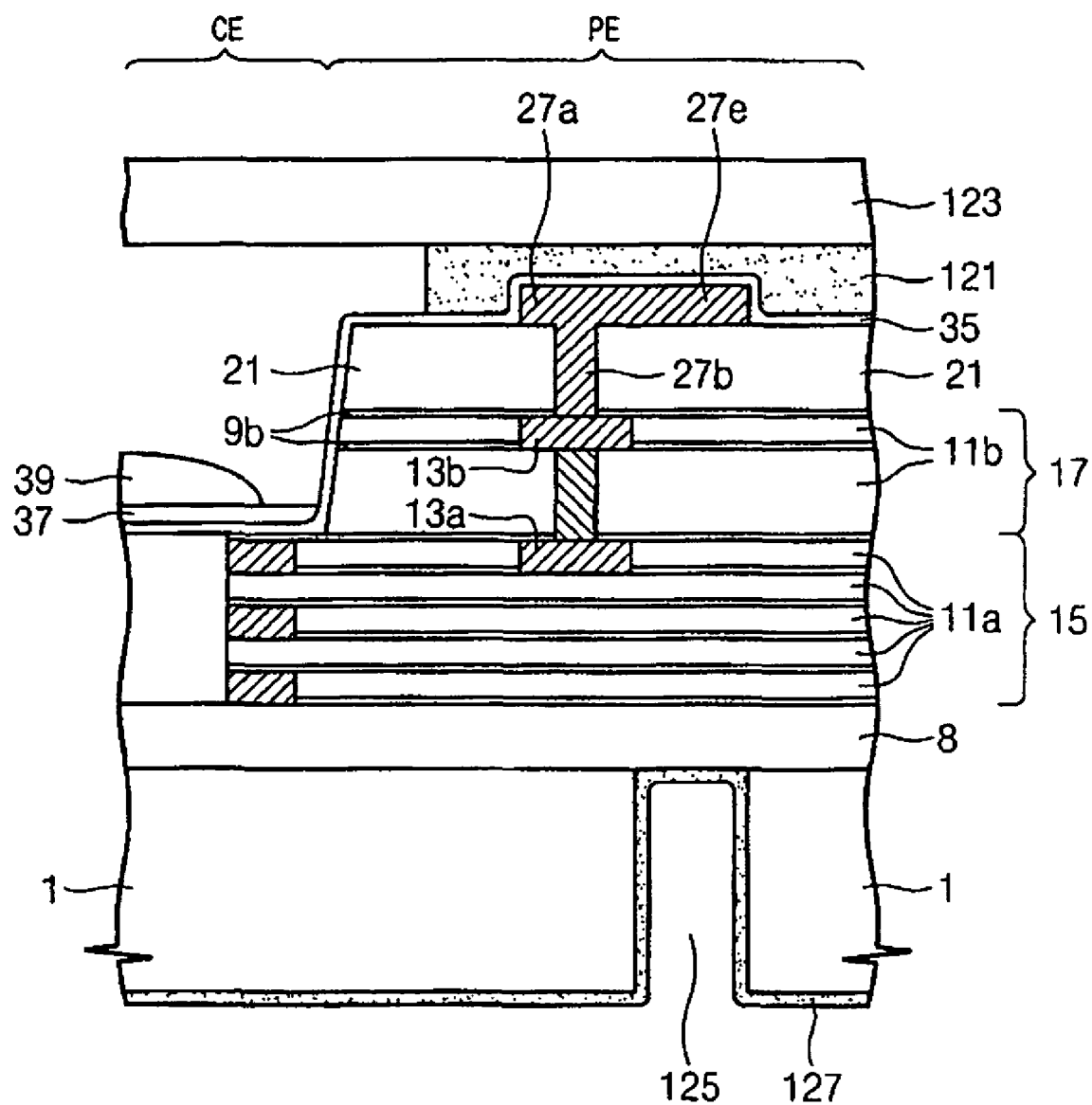

Referring to FIG. 13, first through holes 125 may be formed to penetrate the semiconductor substrate 1. Thus, first through holes 125 may expose portions of the shield layer 8. The first through holes 125 may be formed below the extensions 27e of the conductive pads 27a. That is, the first through holes 125 may not overlap the first and second interconnections 13a and 13b. A spacer insulation layer 127 may be then formed on the semiconductor substrate 1 and an inner surface of the first through hole 125.

Figure 14:
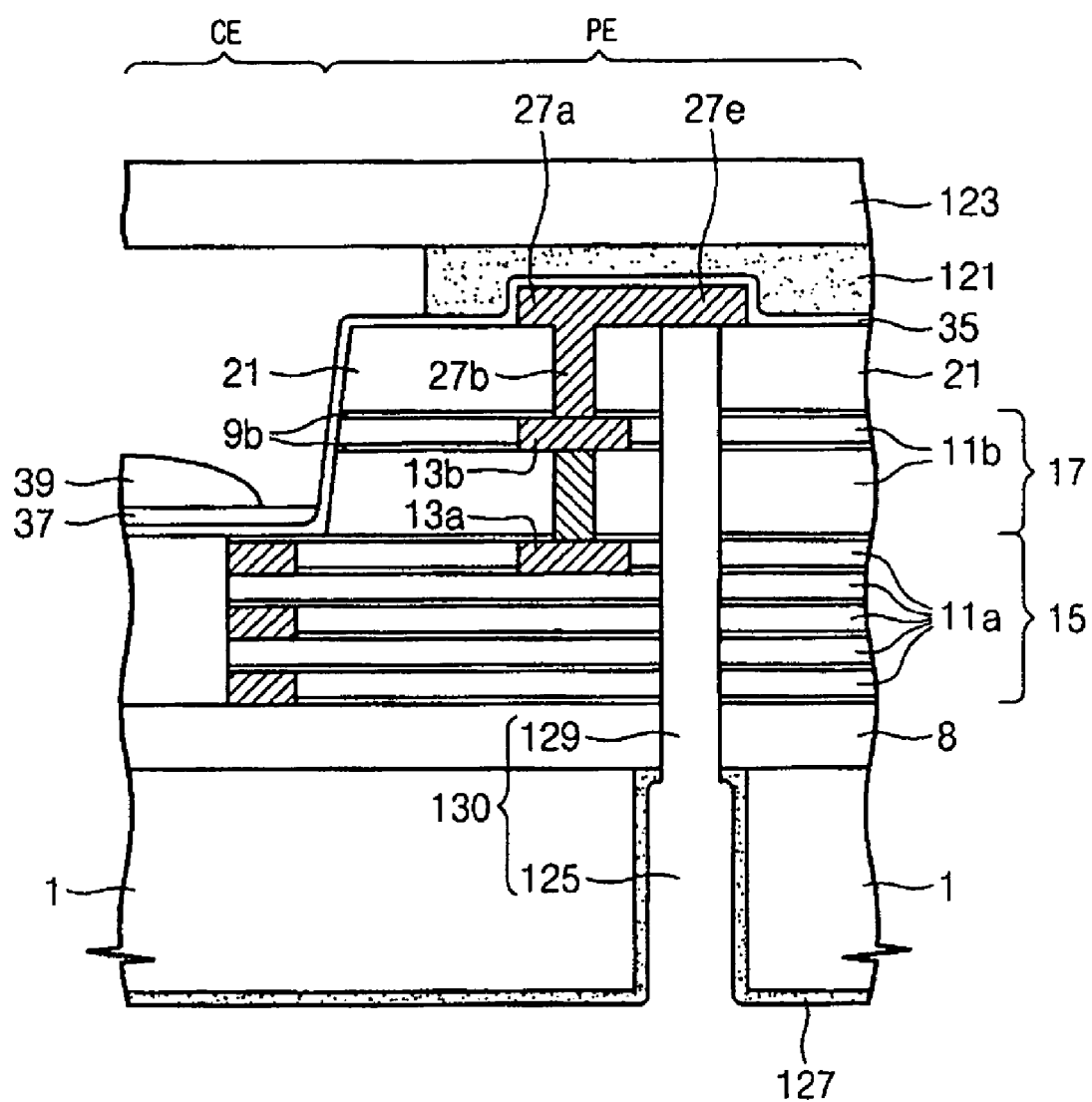

Referring to FIG. 14, second through holes 129 may be formed to penetrate the shield layer 8, the dielectric layers 15 and 17, and the passivation layer 21. The second through holes 129 may be formed to extend from the first though hole 125 and reach the extensions 27e of the conductive pads 27a. Therefore, the second though holes 129 may expose the extensions 27e of the conductive pads 27a. The second through holes 129 may be formed to have a width less than that of the first through holes 125. At least sidewalls of the first through holes 125 and an entire back surface of the semiconductor substrate 1 may be covered with the spacer insulation layer 127 even after formation of the second through holes 129. One of the first through holes 125 and one of the second through holes 129, which are connected to each other, may constitute a through hole 130.

Figure 15:
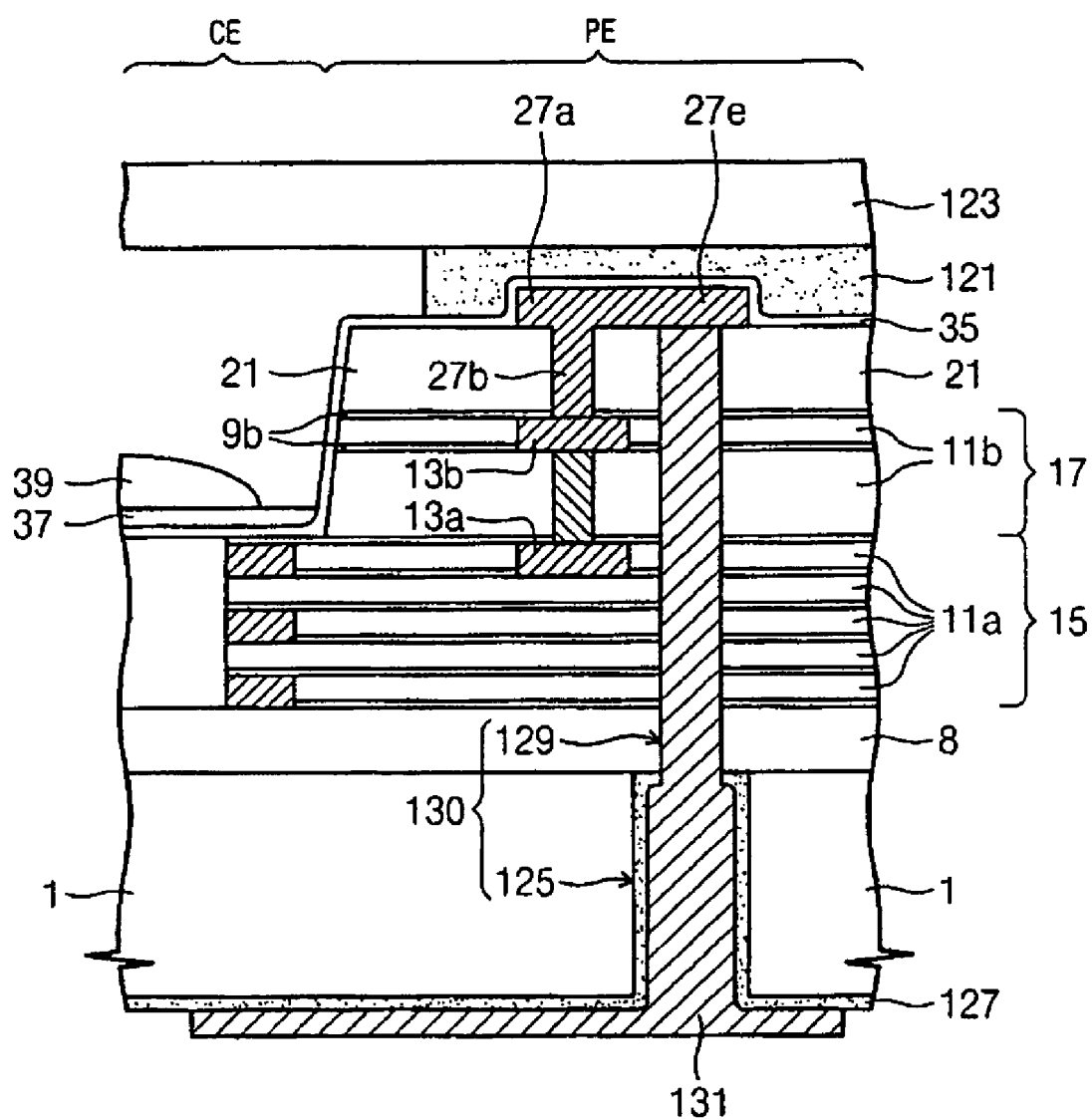

Referring to FIG. 15, a conductive layer is formed on the spacer insulation layer 127 and in the through holes 130. The conductive layer may completely fill the through holes 130 and directly contact the exposed extensions 27e of the conductive pads 27a. The conductive layer may be patterned to form through electrodes 131 in the through holes 130. The through electrodes 131 may extend to have line configurations formed over the back surface of the semiconductor substrate 1 when viewed from a plan view. As a result, the through electrodes 131 may be electrically insulated from the semiconductor substrate 1 by the spacer insulation layer 127. Further, the through electrodes 131 may be electrically connected to the conductive pads 27a via the through holes 130.

Figure 16:
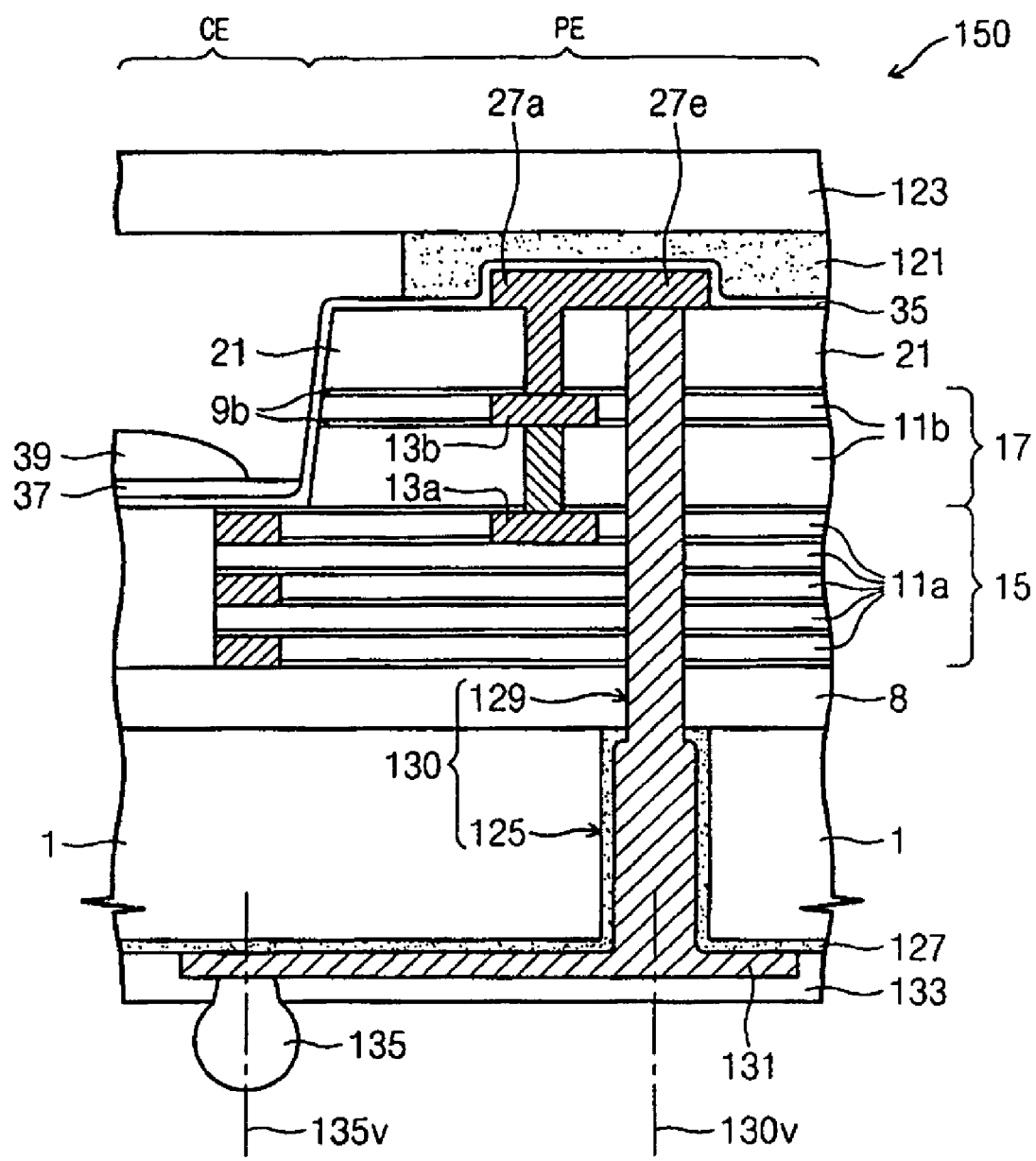

Referring to FIG. 16, a capping insulation layer 133 is formed on the through electrodes 131 and the spacer insulation layer 127. The capping insulation layer 133 is patterned to expose predetermined regions of the through electrodes 131. External terminals 135 may be formed on the exposed through electrodes 131. The external terminals 135 may be, for example, solder balls or solder bumps. As a result, an image sensing device 150 (e.g., an image sensor package) may be completed to have the external terminals 135 disposed on the backside of the semiconductor substrate 1. In an exemplary embodiment, at least one the external terminals 135 may not be self-aligned with the corresponding through holes 130. That is, a vertical axis 135v passing through a central point of the external terminal 135 may be spaced apart from a vertical axis 130v passing through a central point of the through hole 130 adjacent to the external terminal 135, as illustrated in FIG. 16. In this case, the through electrodes 131 may have the same function as the redistribution lines 103 described with reference to FIG. 10. Thus, the external electrodes 131 may be disposed at required regions regardless of the positions of the conductive pads 27a.

Figure 17:
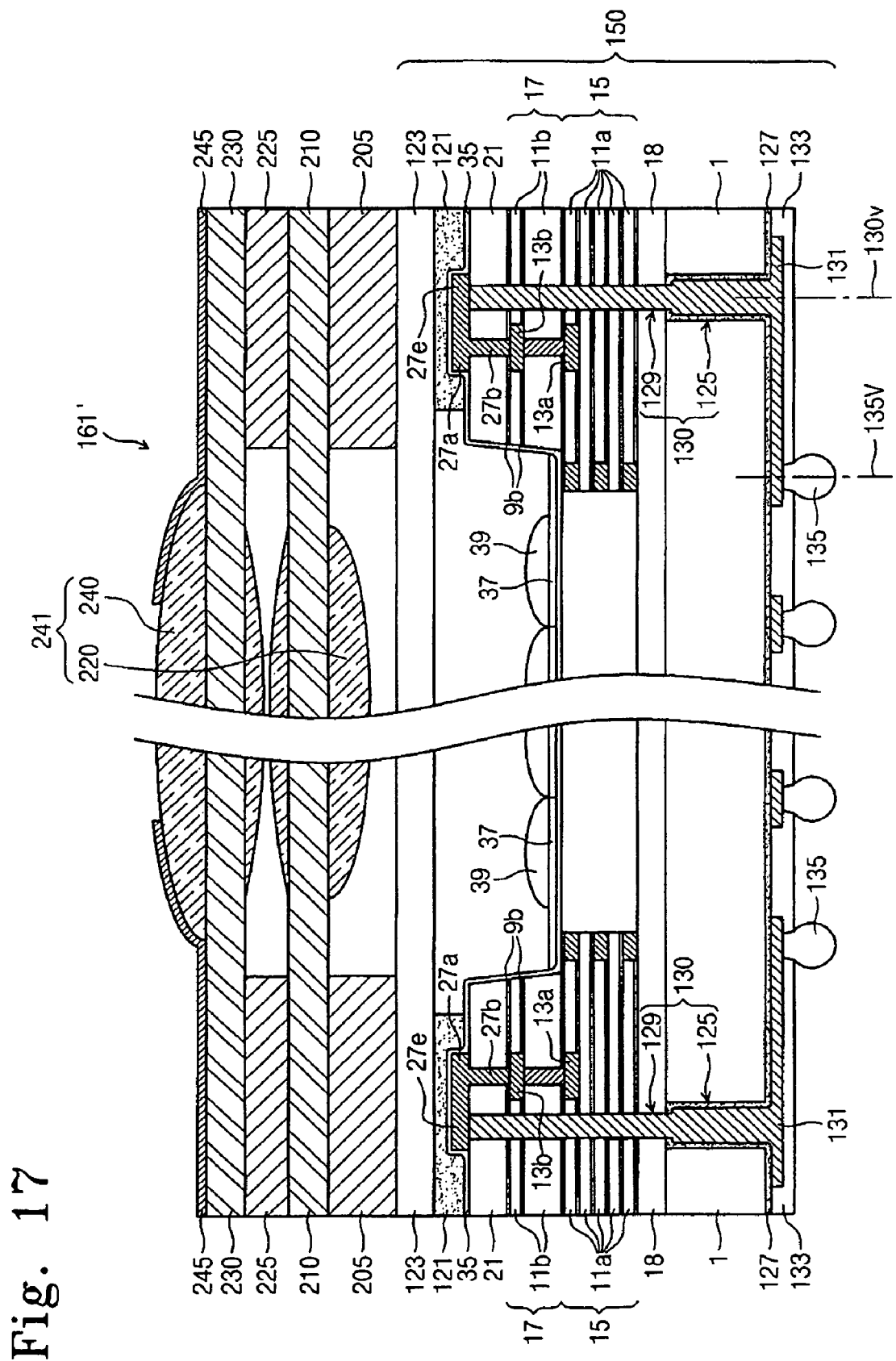
FIG. 17 is a cross sectional view illustrating a single image sensor package module including an image sensor package as shown in FIG. 16.

FIG. 17 is a cross sectional view illustrating a single image sensor package module including an image sensor package shown in FIG. 16.

Referring to FIG. 17, at least one optical lens, for example, a lower optical lens 220 and an upper optical lens 240 may be sequentially stacked on the pixel region CE of the image sensor package 150 shown in FIG. 16. The first and second optical lenses 220 and 240 may constitute an optical lens 241. The lower and upper optical lenses 220 and 240 may be fixed to a lower transparent substrate 210 and an upper transparent substrate 230, respectively. That is, the lower optical lens 220 may be attached to a bottom surface and a top surface of the lower transparent substrate 210, and the upper optical lens 240 may be attached to a bottom surface and a top surface of the upper transparent substrate 230. The lower and upper transparent substrates 210 and 230 may be fixed to the image sensor package 150 using lower and upper supporting members 205 and 225, respectively.

A diaphragm 245 may be disposed on the top surface of the upper transparent substrate 230 and a portion of the upper optical lens 240 may be exposed by the diaphragm 245. The diaphragm 245 may be formed of an opaque material which blocks lights. For example, the diaphragm 245 may be formed of a black material such as a photoresist layer. Thus, external lights may be irradiated onto the pixel region CE of the image sensor package 150 through the exposed portion of the upper optical lens 240, the upper transparent substrate 230, the lower optical lens 220 and the lower transparent substrate 210.

The image sensor package 150 shown in FIG. 16 may be a wafer level package. In this case, a plurality of image sensor packages 150 may be formed on the semiconductor substrate 1 such as, for example, a semiconductor wafer, and the supporting members 205 and 225, the transparent substrates 210 and 230, the optical lenses 220 and 240, and the diaphragm 245 may be formed on the semiconductor wafer 1 including the plurality of image sensor packages 150. Subsequently, the substrate including the optical lenses 220 and 240 and the image sensor packages 150 may be sliced using, for example, a die sawing technique, thereby providing a plurality of image sensor package modules 161' which are separated from each other. Each of the image sensor package modules 161' may have a cross sectional view illustrated in FIG. 17.

Figure 18:
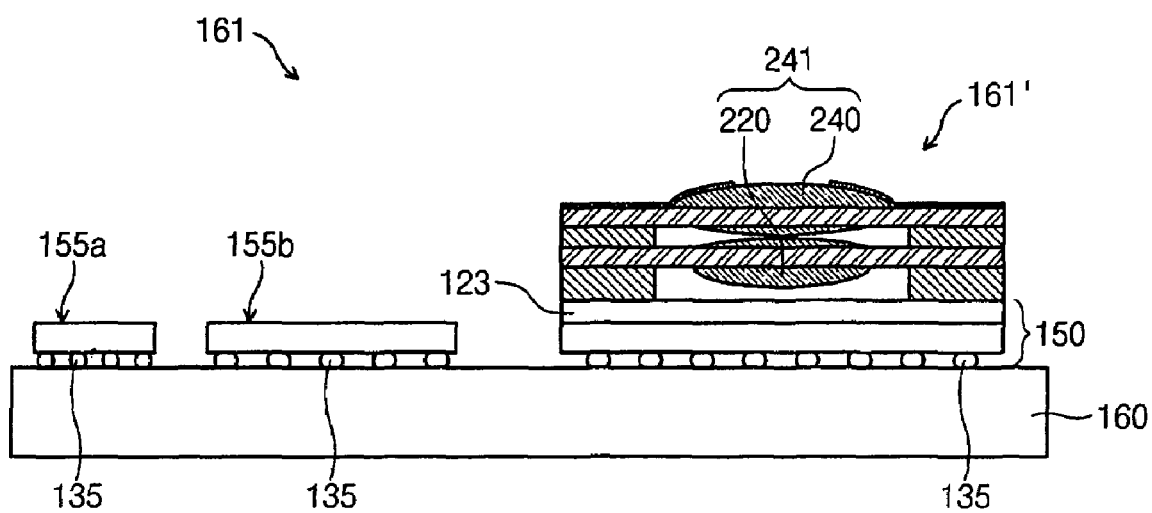
FIG. 18 is a cross sectional view illustrating yet another image sensor package module including a single image sensor package module shown in FIG. 17.

FIG. 18 is a cross sectional view illustrating yet another image sensor package module 161 including the single image sensor package module 161' shown in FIG. 17.

Referring to FIG. 18, a wiring substrate 160 may be provided. The single image sensor package module 161' illustrated in FIG. 17 may be mounted on the wiring substrate 160. Further, at least one semiconductor package may be mounted on the wiring substrate 160. The at least one semiconductor package may be located to be spaced apart from the single image sensor package module 161'. In an exemplary embodiment, the at least one semiconductor package may comprise one or more semiconductor packages. For example, the at least one semiconductor package may comprise a non-memory semiconductor package 155a and a memory semiconductor package 155b. The non-memory semiconductor package 155a may include, for example, at least one of an analog to digital converter (an A/D converter), a digital to analog converter (a D/A converter) and a digital signal processor (DSP). The memory semiconductor package 155b may include a nonvolatile memory package such as, for example, a flash memory package or an EEPROM package. Each of the non-memory semiconductor package 155a and the memory semiconductor package 155b may have the external terminals 135 like the image sensor package 150. The single image sensor package module 161' including the image sensor package 150 and the semiconductor packages 155a and 155b may be mounted on the wiring substrate 160 so that the external terminals 135 of the packages 150, 155a and 155b may face the wiring substrate 160. As a result, an image sensor package module 161 having the through electrodes 131 and the external terminals 135 may be completed.

Figure 19:
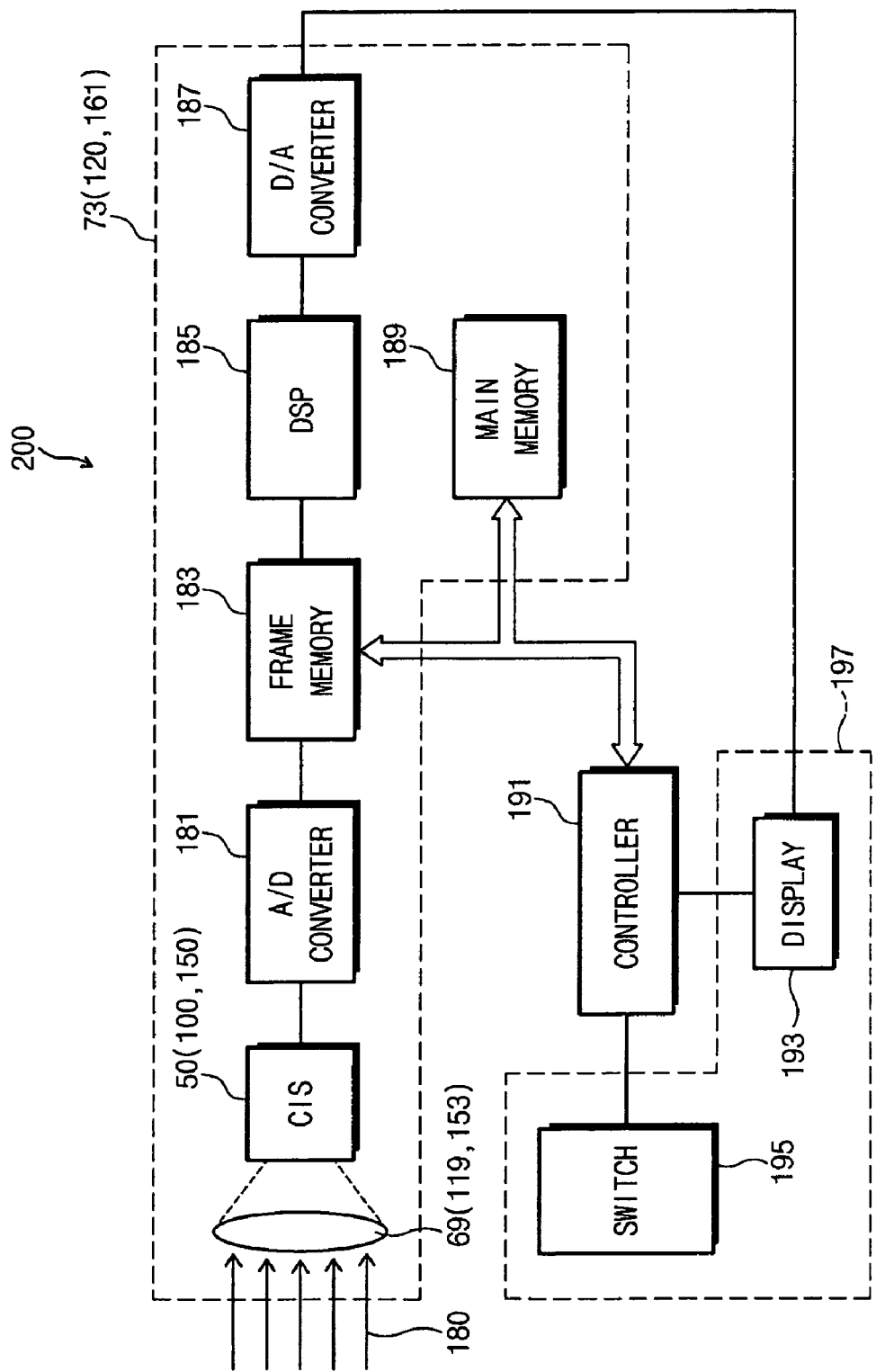
FIG. 19 is a schematic block diagram illustrating an electronic product employing one of the image sensor package modules according to exemplary embodiments of the present invention.

FIG. 19 is a schematic block diagram illustrating an electronic product employing one of the image sensor package modules according to exemplary embodiments of the present invention.

Referring to FIG. 19, the electronic product 200 may comprise a controller 191, one of the image sensor package modules 73, 120 and 161 illustrated in FIGS. 8, 11 and 18, and an input/output (I/O) module 197. The controller 191 may control the operations of the image sensor package module 73, 120 or 161 and the I/O module 197. The image sensor package module 73, 120 or 161 may include one of the image sensing devices 50, 100 and 150 illustrated in FIGS. 7, 10 and 16. The image sensor package module 73, 120 or 161 may further include the optical lens 69, 119 or 241 illustrated in FIG. 8, 11 or 18. External lights 180 reflected from an object may pass through the optical lens 69, 119 or 241 and may be irradiated onto at least the pixel region CE of the image sensing device 50, 100 or 150. The image sensing device 50, 100 or 150 may generate electrical image data which correspond to the object. The electrical image data generated from the image sensing device 50, 100 or 150 may be analog data.

The image sensor package module 73, 120 or 161 may further include at least one non-memory semiconductor device and at least one memory device. For example, the image sensor package module 73, 120 or 161 may include an A/D converter 181 coupled to output terminals of the image sensing device 50, 100 or 150, a frame memory 183 coupled to output terminals of the A/D converter 181, a DSP 185 coupled to I/O terminals of the frame memory 183, a D/A converter 187 coupled to output terminals of the DSP 185 and a main memory 189 coupled to the frame memory 183 and the controller 191. In this case, the controller 191 may control the operations of the frame memory 183 and the main memory 189.

The I/O module 197 may include a switch unit 195 and a display unit 193. The switch unit 195 may provide input data regarding the operations of the image sensor package module 73, 120 or 161 and the controller 191, and the display unit 193 may convert output data generated from the image sensor package module 73, 120 or 161 into visual image data.

The A/D converter 181 may convert the electrical image data generated from the image sensing device 50, 100 or 150 into digital data. The digital data generated from the A/D converter 181 may be temporarily stored in the frame memory 183. The digital data stored in the frame memory 183 may be appropriately processed by the DSP 185, and the D/A converter 187 may convert output data of the DSP 185 into analog data. The analog data of the D/A converter 187 may be transmitted to the display unit 193 of the I/O module 197, and the display unit 193 may convert the analog data generated from the D/A converter 187 into visual image data and may exhibit the visual image data on a screen.

The digital data temporarily stored in the frame memory 183 may be recorded in the main memory 189 by the controller 191. The digital data in the main memory 189 may also be converted into analog data through the frame memory 183, the DSP 185 and the D/A converter 187, and the display unit 193 may exhibit visual images which correspond to the analog data of the D/A converter 187. The visual images corresponding to the digital data in the main memory 189 may be displayed on a screen of the display unit 193 at any time by operating the switch unit 195.

The electronic product 200 described above may be a digital camera. That is, the image sensor package module 73, 120 or 161 according to the exemplary embodiments of the present invention may be employed in the digital camera. However, the electronic product 200 may not be limited to a digital camera. In other words, the image sensor package module 73, 120 or 161 of exemplary embodiments of the present invention may be applied to various electronic products other than the digital camera. For example, the image sensor package module 73, 120 or 161 may be employed in a mobile phone, a personal computer camera, or the like.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor package comprising:
an image sensor chip;
a handling substrate mounted on a front side of the image sensor chip; and
a through electrode disposed on a backside of the image sensor chip, the through electrode extending into the image sensor chip,
wherein the image sensor chip comprising:
a semiconductor substrate having a pixel region and a peripheral circuit region;
a photoelectric transformation section disposed in the semiconductor substrate of the pixel region;
a dielectric layer disposed on a front surface of the semiconductor substrate, the dielectric layer having a step region so that a top surface of the dielectric layer in the pixel region is lower than that of the dielectric layer in the peripheral circuit region; and
a conductive pad disposed on the dielectric layer in the peripheral circuit region and electrically connected to the through electrode.

2. The image sensor package as recited in claim 1, wherein the handling substrate comprising a transparent glass substrate.

3. The image sensor package as recited in claim 1, further comprising an external terminal disposed on the through electrode.

4. The image sensor package as recited in claim 3, wherein the external terminal comprising one of a solder ball and a solder bump.

5. The image sensor package as recited in claim 3, wherein a vertical axis passing through a central point of the external terminal is spaced apart from a vertical axis passing through a central point of the conductive pad connected to the external terminal.

6. The image sensor package as recited in claim 3, further comprising:
a spacer insulation layer disposed between the through electrode and the semiconductor substrate, the spacer insulating layer extending to cover a backside of the semiconductor substrate; and
a capping insulation layer disposed on the through electrode and the spacer insulation layer,
wherein the external terminal penetrates the capping insulation layer to be in contact with the through electrode.

7. The image sensor package as recited in claim 1, wherein the dielectric layer comprising:
a plurality of intermediate interconnection layers disposed on the semiconductor substrate including the photoelectric transformation section; and
at least one top interconnection layer disposed on the intermediate interconnection layers and located only in the peripheral circuit region.

8. The image sensor package as recited in claim 7, further comprising a resin layer disposed in the intermediate interconnection layers of the pixel region and located on the photoelectric transformation section.

9. The image sensor package as recited in claim 1, further comprising a resin layer disposed in the dielectric layer of the pixel region and located on the photoelectric transformation section.

10. The image sensor package as recited in claim 9, wherein the resin layer has a transmittance of at least about 50 percent, and wherein a top surface of the resin layer is lower than a top surface of the dielectric layer in the peripheral circuit region.

11. The image sensor package as recited in claim 10, wherein the top surface of the resin layer is substantially coplanar with a top surface of the dielectric layer in the pixel region.

12. The image sensor package as recited in claim 9, further comprising a micro lens disposed on the resin layer.

13. The image sensor package as recited in claim 12, further comprising a planarization layer disposed between the micro lens and the resin layer,
wherein the planarization layer extends to cover the conductive pad, and wherein the planarization layer in the peripheral circuit region is adhered to the handling substrate.

14. The image sensor package as recited in claim 1, further comprising:
a passivation layer disposed on the dielectric layer in the peripheral circuit region,
wherein the conductive pad is disposed on the passivation layer.

15. An image sensor package module comprising:
an image sensor package; and
an optical lens mounted on a front surface of the image sensor package,
wherein the image sensor package comprising:
a semiconductor substrate having a pixel region and a peripheral circuit region;
a photoelectric transformation section disposed in the semiconductor substrate of the pixel region;
a dielectric layer disposed on a front surface of the semiconductor substrate, the dielectric layer having a step region so that a top surface of the dielectric layer in the pixel region is lower than that of the dielectric layer in the peripheral circuit region;
a conductive pad disposed on the dielectric layer in the peripheral circuit region;

a handling substrate disposed over the dielectric layer and the conductive pad; and a through electrode disposed on a back surface of the image sensor chip and electrically connected to the conductive pad, wherein the through electrode extending into the semiconductor substrate and the dielectric layer, and wherein the optical lens is disposed over the handling substrate.

16. The image sensor package module as recited in claim 15, further comprising:

a transparent substrate disposed on the handling substrate and opposite the dielectric layer, the optical lens being attached to the transparent substrate; and a supporting member configured to fix the transparent substrate to the handling substrate.

17. The image sensor package module as recited in claim 15, wherein the interlayer dielectric layer comprising:

a plurality of intermediate interconnection layers disposed on the semiconductor substrate including the photoelectric transformation section; and at least one top interconnection layer disposed on the intermediate interconnection layers and located only in the peripheral circuit region.

18. The image sensor package module as recited in claim 17, wherein the image sensor package further comprising a resin layer disposed in the intermediate interconnection layers of the pixel region and located on the photoelectric transformation section.

19. The image sensor package module as recited in claim 15, wherein the image sensor package further comprising a resin layer disposed in the dielectric layer of the pixel region and located on the photoelectric transformation section.

20. The image sensor package module as recited in claim 19, wherein the resin layer has a transmittance of at least about 50 percent, and wherein a top surface of the resin layer is lower than a top surface of the dielectric layer in the peripheral circuit region.

21. The image sensor package module as recited in claim 20, wherein the top surface of the resin layer is substantially coplanar with a top surface of the dielectric layer in the pixel region.

22. The image sensor package module as recited in claim 19, wherein the image sensor package further comprising a micro lens disposed on the resin layer.

23. The image sensor package module as recited in claim 22, wherein the image sensor package further comprising a planarization layer disposed between the micro lens and the resin layer, wherein the planarization layer extends to cover the conductive pad, and wherein the planarization layer in the peripheral circuit region is adhered to the handling substrate.

24. The image sensor package module as recited in claim 15, wherein the image sensor package further comprising a passivation layer disposed on the dielectric layer in the peripheral circuit region, and wherein the conductive pad is disposed on the passivation layer.

25. The image sensor package module as recited in claim 15, wherein the image sensor package further comprising:

an external terminal disposed on the through electrode;

a spacer insulation layer disposed between the through electrode and the semiconductor substrate, the spacer insulating layer extending to cover a backside of the semiconductor substrate; and a capping insulation layer disposed on the through electrode and the spacer insulation layer, wherein the external terminal penetrates the capping insulation layer to be in contact with the through electrode.

26. The image sensor package module as recited in claim 25, wherein the external terminal comprising one of a solder ball and a solder bump.

27. The image sensor package module as recited in claim 25, wherein a vertical axis passing through a central point of the external terminal is spaced apart from a vertical axis passing through a central point of the conductive pad connected to the external terminal.

28. The image sensor package module as recited in claim 15, wherein the handling substrate comprising a transparent glass substrate.

29. The image sensor package module as recited in claim 15, further comprising:

a wiring substrate on which the image sensor package is mounted; and at least one semiconductor package mounted on the wiring substrate.

30. The image sensor package module as recited in claim 29, wherein the at least one semiconductor package comprising at least one of a non-memory device and a memory device.

31. The image sensor package module as recited in claim 30, wherein the non-memory device comprising at least one of an analog to digital converter (an A/D converter), a digital to analog converter (a D/A converter) and a digital signal processor (DSP), and wherein the memory device comprising a nonvolatile memory device.

* * * * *